United States Patent
Lee et al.

(10) Patent No.: US 12,403,777 B2
(45) Date of Patent: Sep. 2, 2025

(54) POWER CONTROL SYSTEM FOR DC-DC CONVERTER AND INVERTER PRE-CHARGING AND SHUTDOWN

(71) Applicant: GM GLOBAL TECHNOLOGY OPERATIONS LLC, Detroit, MI (US)

(72) Inventors: Chunhao J. Lee, Troy, MI (US); Lei Hao, Troy, MI (US); Dongxu Li, Troy, MI (US); Suresh Gopalakrishnan, Troy, MI (US)

(73) Assignee: GM GLOBAL TECHNOLOGY OPERATIONS LLC, Detroit, MI (US)

( * ) Notice: Subject to any disclaimer, the term of this patent is extended or adjusted under 35 U.S.C. 154(b) by 809 days.

(21) Appl. No.: 17/538,920

(22) Filed: Nov. 30, 2021

(65) Prior Publication Data
US 2023/0166633 A1    Jun. 1, 2023

(51) Int. Cl.
| | |
|---|---|
| *B60L 50/51* | (2019.01) |
| *B60L 1/00* | (2006.01) |
| *B60L 58/18* | (2019.01) |
| *H02M 1/00* | (2006.01) |
| *H02M 1/36* | (2007.01) |
| *H02M 3/158* | (2006.01) |
| *H02M 7/5387* | (2007.01) |

(Continued)

(52) U.S. Cl.
CPC .............. *B60L 50/51* (2019.02); *B60L 1/003* (2013.01); *B60L 58/18* (2019.02); *H02M 1/0003* (2021.05); *H02M 1/36* (2013.01); *H02M 3/158* (2013.01); *H02M 7/5387* (2013.01); *B60L 2210/10* (2013.01); *B60L 2210/42* (2013.01); *B60L 2240/527* (2013.01); *B60L 2240/547* (2013.01); *G01R 19/16538* (2013.01); *H02J 7/34* (2013.01); *H02J 7/345* (2013.01); *H02M 1/32* (2013.01); *H02M 1/322* (2021.05)

(58) Field of Classification Search
CPC ...... H02M 1/0003; H02M 1/007; H02M 1/36; H02M 3/158; H02M 7/5387; H02M 1/322; H02M 1/32; B60L 58/18; B60L 50/51; B60L 1/003; B60L 2210/10; B60L 2210/42; B60L 2240/527; B60L 2240/547; H02J 7/34; H02J 7/345
See application file for complete search history.

(56) References Cited

U.S. PATENT DOCUMENTS

| | | | |
|---|---|---|---|
| 2004/0026140 A1* | 2/2004 | Suzuki | B60L 58/21 903/903 |
| 2005/0093523 A1* | 5/2005 | Wu | H02M 1/4208 323/222 |

(Continued)

FOREIGN PATENT DOCUMENTS

EP    4117155 A1 *   1/2023   .......... H02M 1/0003

*Primary Examiner* — Gary L Laxton

(57) ABSTRACT

A power control system for a propulsion system of a vehicle includes an energy storage system including a precharge circuit and one or more battery packs. A DC-DC converter is connected to the energy storage system and including a first capacitor, a first plurality of power switches and an inductor. A power inverter module is connected to the DC-DC converter and including a second capacitor and a second plurality of power switches. A controller is configured to pre-charge the first capacitor of the DC-DC converter and the second capacitor of the power inverter module and control operating modes of the DC-DC converter and the power inverter module.

17 Claims, 6 Drawing Sheets

(51) Int. Cl.
　　　*G01R 19/165*　　　(2006.01)
　　　*H02J 7/34*　　　(2006.01)
　　　*H02M 1/32*　　　(2007.01)

(56)　　　　　References Cited

U.S. PATENT DOCUMENTS

2013/0110337 A1* 　5/2013　Kondoh ................. B60L 58/20
　　　　　　　　　　　　　　　　　　　　　701/22
2020/0122582 A1* 　4/2020　Curuvija ................ B60L 50/40

* cited by examiner

POWER CONTROL SYSTEM FOR DC-DC CONVERTER AND INVERTER PRE-CHARGING AND SHUTDOWN

INTRODUCTION

The information provided in this section is for the purpose of generally presenting the context of the disclosure. Work of the presently named inventors, to the extent it is described in this section, as well as aspects of the description that may not otherwise qualify as prior art at the time of filing, are neither expressly nor impliedly admitted as prior art against the present disclosure.

The present disclosure relates to battery systems and more particularly to a power control system for battery systems of battery electric vehicles (BEVs) including DC-DC converters.

Battery electric vehicles (BEVs) include one or more battery packs each including one or more battery cells. A battery system is used to control charging and discharging of the battery. During operation, one or more electric motors of the BEV are used to provide propulsion for the vehicle. The power stored by the battery pack(s) is depleted after usage and the BEV is recharged. Options for recharging the battery pack(s) include plugging into utility power at a charging station such as a commercial charging station or a home charging station. Other options may include charging one BEV using the power stored in another BEV.

As can be appreciated, the battery pack of the BEV may be depleted while the vehicle is not at the home of the owner. Currently, the amount of time that is required to fully recharge the battery pack(s) is typically on the order of 4-12 hours for a full charge depending upon various factors. The charging period is significantly longer than the amount of time that is required to fill a fuel tank of a vehicle including an internal combustion engine (less than 10 minutes).

Some BEV(s) have adopted higher voltage battery systems to allow charging of the battery pack(s) more quickly to reduce charging times. For example, some fast charging systems can charge the battery pack to 80% capacity in less than one hour. Operation at higher voltage levels requires additional precautions to reduce damage to components of the power control system that may occur during startup and when shutting down.

SUMMARY

A power control system for a propulsion system of a vehicle includes an energy storage system including a pre-charge circuit and one or more battery packs. A DC-DC converter is connected to the energy storage system and including a first capacitor, a first plurality of power switches and an inductor. A power inverter module is connected to the DC-DC converter and including a second capacitor and a second plurality of power switches. A controller is configured to pre-charge the first capacitor of the DC-DC converter and the second capacitor of the power inverter module and control operating modes of the DC-DC converter and the power inverter module.

In other features, the controller is configured to, after pre-charging the first capacitor of the DC-DC converter, control an output voltage of the DC-DC converter to ramp up voltage across the second capacitor of the power inverter module to pre-charge the second capacitor.

In other features, the controller is configured to, after pre-charging the first capacitor of the DC-DC converter, transition the DC-DC converter from a standby mode to a run mode and control an output voltage of the DC-DC converter to ramp up the voltage across the second capacitor of the power inverter module to pre-charge the second capacitor. When a difference between an input voltage of the power inverter module and a predetermined target voltage is less than a predetermined threshold, the controller transitions the power inverter module from a stop mode to a run mode and the propulsion system from a stop mode to an active mode. When stopping the propulsion system, the controller is configured to ramp down an output voltage of the DC-DC converter to a voltage less than a first predetermined threshold.

In other features, when the output voltage of the DC-DC converter is less than the first predetermined threshold, the controller transitions the power inverter module from a run mode to a stop mode and the DC-DC converter from a run mode to a standby mode. The controller is configured to disconnect the energy storage system and, when an input voltage of the DC-DC converter is less than a second predetermined threshold, transitions the propulsion system from an active mode to a stop mode.

In other features, a bidirectional bypass switch is connected between the power inverter module and the energy storage system. The controller is configured to close the bidirectional bypass switch and concurrently pre-charge the first capacitor and the second capacitor.

In other features, in response to a difference between a voltage across a precharge resistor in the energy storage system and a voltage of the first capacitor being less than a first predetermined threshold, the controller selectively transitions the energy storage system to a regular mode and opens the bidirectional bypass switch. The controller determines a difference between an output voltage of the DC-DC converter and an input voltage of the power inverter module. While the difference is greater than a predetermined threshold, the controller incrementally adjusts the output voltage of the DC-DC converter by a delta voltage. When the difference is less than a predetermined threshold, the controller transitions the power inverter module from a stop mode to a run mode and the propulsion system from an off mode to an active mode.

In other features, when the propulsion system is in an active mode, the bidirectional bypass switch is closed and the DC-DC converter is in standby mode, the controller is configured to stop the propulsion system by disconnecting the energy storage system; and transitioning the power inverter module from a run mode to a stop mode when output voltages of the DC-DC converter and the power inverter module are less than a first predetermined threshold.

In other features, when voltages across the first capacitor and the second capacitor are less than a second predetermined threshold, the controller transitions the propulsion system from the active mode to an off mode.

A power control system for a propulsion system of a vehicle includes an energy storage system including a pre-charge circuit and one or more battery packs. A DC-DC converter is connected to the energy storage system and including a first capacitor, a first plurality of power switches and an inductor. A power inverter module is connected to the DC-DC converter and including a second capacitor and a second plurality of power switches. A controller is configured to pre-charge the first capacitor of the DC-DC converter; transition the DC-DC converter from a standby mode to a run mode; and determine a difference between the output voltage of the DC-DC converter and an input voltage of the power inverter module. While the difference is greater than a first predetermined threshold, ramp the output voltage of the DC-DC converter. When the difference is less than the first predetermined threshold, transition the power inverter module from a stop mode to a run mode and the propulsion system from an off mode to an active mode.

In other features, when stopping the propulsion system, the controller is configured to selectively ramp down the output voltage of the DC-DC converter; when the output voltage of the DC-DC converter is less than a second predetermined threshold, transition the power inverter module from a run mode to a stop mode and the DC-DC converter from a run mode to a standby mode; disconnect the energy storage system; and when an input voltage of the DC-DC converter is less than a third predetermined threshold, transition the propulsion system from an active mode to a stop mode.

A power control system for a propulsion system of a vehicle includes an energy storage system including a pre-charge circuit and one or more battery packs. A DC-DC converter is connected to the energy storage system and including a first capacitor, a first plurality of power switches, an inductor and a bidirectional bypass switch. A power inverter module is connected to the DC-DC converter and including a second capacitor and a second plurality of power switches; A bidirectional bypass switch is connected between the power inverter module and the energy storage system. A controller is configured to close the bidirectional bypass switch and concurrently pre-charge the first capacitor and the second capacitor and after pre-charging the first capacitor and the second capacitor, transition a mode of the DC-DC converter from a standby mode to a run mode.

In other features, the controller is configured to calculate a difference between the output voltage of the DC-DC converter and an input voltage of the power inverter module. When the difference is greater than a predetermined threshold, the controller is configured to incrementally adjust the output voltage of the DC-DC converter by a delta voltage. When the difference is less than the predetermined threshold, the controller is configured to transition the power inverter module from a stop mode to a run mode and the propulsion system from an off mode to an active mode.

In other features, when the propulsion system is in an active mode, the bidirectional bypass switch is closed and the DC-DC converter is in standby mode, the controller is configured to stop the propulsion system by disconnecting the energy storage system and transitioning the power inverter mode from a run mode to a stop mode when an output voltage of the DC-DC converter and an input voltage of the power inverter module are less than a first predetermined threshold. When voltages of the first capacitor and the second capacitor are less than a second predetermined threshold, the controller transitions the propulsion system from the active mode to an off mode.

Further areas of applicability of the present disclosure will become apparent from the detailed description, the claims and the drawings. The detailed description and specific examples are intended for purposes of illustration only and are not intended to limit the scope of the disclosure.

BRIEF DESCRIPTION OF THE DRAWINGS

The present disclosure will become more fully understood from the detailed description and the accompanying drawings, wherein.

In the drawings, reference numbers may be reused to identify similar and/or identical elements.

DETAILED DESCRIPTION

When starting operation of an electric vehicle, components of the power control system such as the DC-DC converter or power inverter module (PIM) may be damaged by high in-rush current. Care must also be taken when shutting down the power control system to avoid damage. A power control system according to the present disclosure controls charging and discharging capacitors of the DC-DC converter and PIM when starting and shutting down, respectively, to avoid damaging the components of the power control system.

Figure 1:
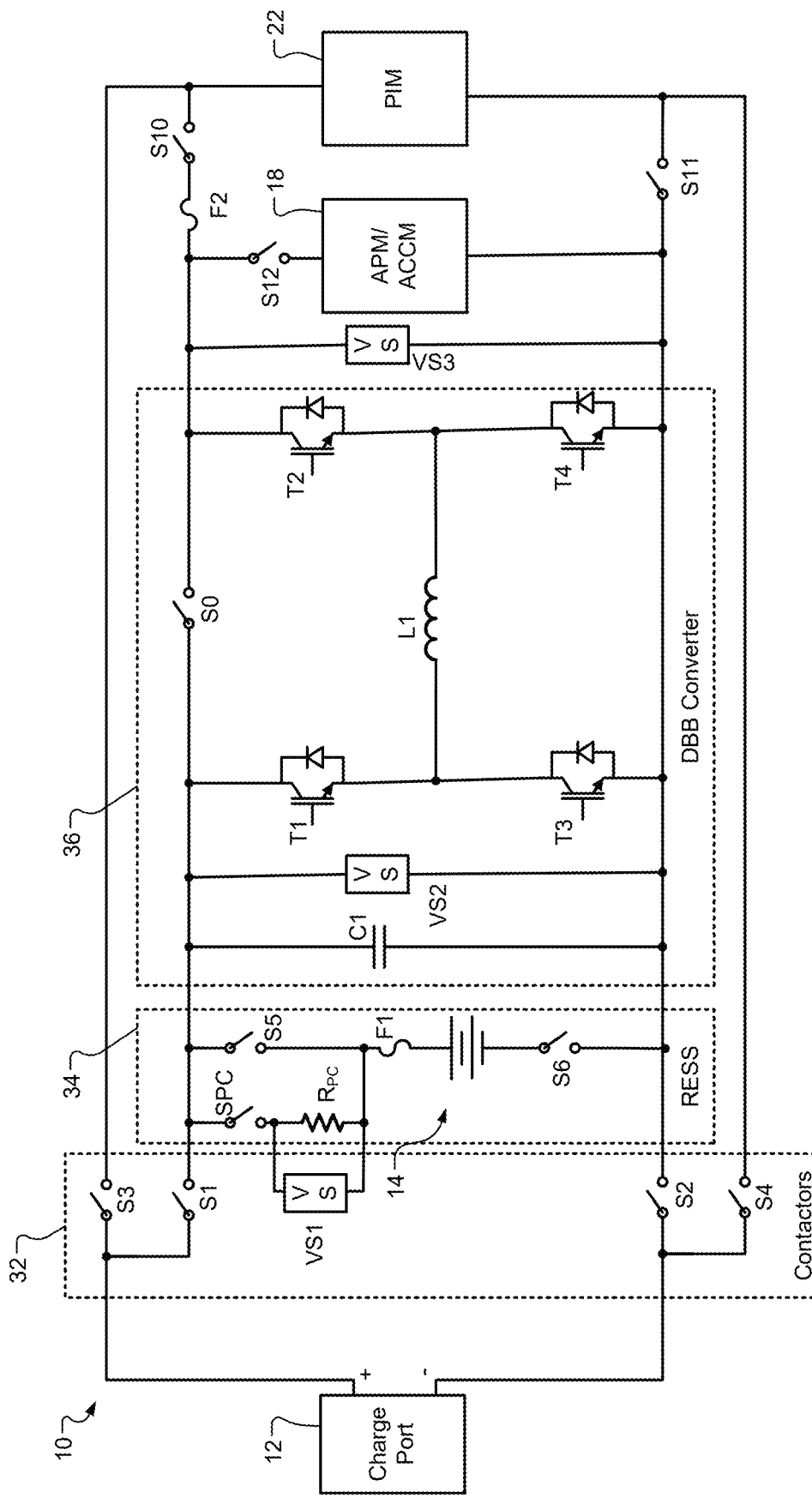
FIG. 1 is a functional block diagram and electrical schematic of an example of a power control system including a DC-DC converter for a battery system of a vehicle according to the present disclosure.

Referring now to FIG. 1, a power control system 10 is shown. While a specific power control system is shown for illustration purposes, the power control system can be configured differently depending on the particulars of a given system. The power control system 10 in this example includes a charge port 12 and provides power to first vehicle loads 18 (such as an accessory power module (APM), AC compressor module ACCM and/or other load), a power inverter module (PIM) 22, and/or other vehicle loads. The power control system 10 further includes contactors 32, a rechargeable energy storage system (RESS) 34, and a DC-DC converter 36. The DC-DC converter 36 can operate as a buck converter, a boost converter or a buck-boost converter.

The contactors 32 in this example include a resistor $R_{PC}$, switches S1 and S3 having a first terminal connected to a positive terminal of the charge port 12. The contactors 32 further include switches S1 and S4 having first terminals connected to a negative terminal of the charge port 12.

The RESS 34 in this example includes a battery pack 14 and switches SPC, S5 and S6. A precharging circuit includes the switch S6, the resistor $R_{PC}$ and the switch SPC. First terminals of the switches SPC and S5 are connected to a second terminal of the switch S1. A second terminal of the switch SPC is connected by the resistor $R_{PC}$ to a second terminal of the switch S5 and a first terminal of a fusible link F1. A second terminal of the fusible link F1 is connected to a positive terminal of the battery pack 14 including one or more battery cells. A negative terminal of the battery pack 14 is connected to a first terminal of a switch S6. A second terminal of the switch S6 is connected to a second terminal of the switch S2.

In some examples, the DC-DC converter 36 may include a buck-boost converter. The DC-DC converter 36 includes a capacitor C1 having a first terminal connected to the first terminal of the switch S1 and a second terminal connected to the second terminal of the switch S2. A first terminal of a power switch T1 is connected to the second terminal of the switch S1 and a first terminal of a bidirectional bypass switch S0. A second terminal of the power switch T1 is connected to a first terminal of inductor L1 and a first terminal of a power switch T3. A second terminal of the power switch T3 is connected to the second terminal of the switch S2.

A second terminal of the bidirectional bypass switch S0 is connected to a first terminal of a power switch T2, a second terminal of the switch S3, a first terminal of a switch S12 and a first terminal of the fusible link F2. A second terminal of the power switch T2 is connected to a second terminal of the inductor L1 and a first terminal of a power switch T4. A second terminal of the power switch T4 is connected to the second terminal of the switch S2, a second terminal of the first vehicle loads 18, and a first terminal of a switch S11.

A second terminal of the fusible link F2 is connected to a first terminal of a switch S10. A second terminal of the switch S10 is connected to the power inverter module 22. A second terminal of the power inverter module 22 is connected to the second terminal of the switch S11 and a second terminal of the switch S4.

While specific implementations of the contactors 32, the energy storage system (RESS) 34, and the DC-DC converter 36 are shown for purposes of illustration, other implementations can be used.

Figure 2:
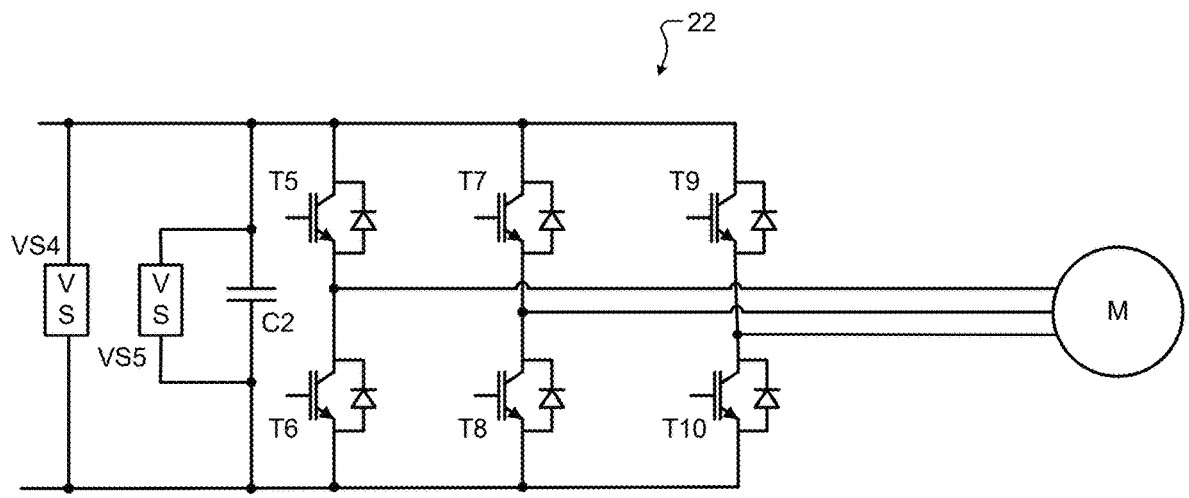
FIG. 2 is a functional block diagram and electrical schematic of an example of a power inverter module of the power control system of FIG. 1.

Referring now to FIG. 2, an example of the power inverter module (PIM) 22 is shown. The power inverter module 22 includes a capacitor C2 and power switches T5 and T6, T7 and T8, and T9 and T10. A first terminal of the capacitor C2 is connected to first terminals of the switches T5, T7 and T9. Second terminals of the power switches are connected to a second terminal of the capacitor C2. The second terminal of the power switch T5 is connected to the first terminal of the power switch T6 and to a first phase of a motor M. The second terminal of the power switch T7 is connected to the first terminal of the power switch T8 and to a second phase of the motor M. The second terminal of the power switch T9 is connected to the first terminal of the power switch T10 and to a third phase of the motor M. While a single inverter and PIM are shown, the electric vehicle may include one or more additional PIM and/or inverter.

Figure 3:
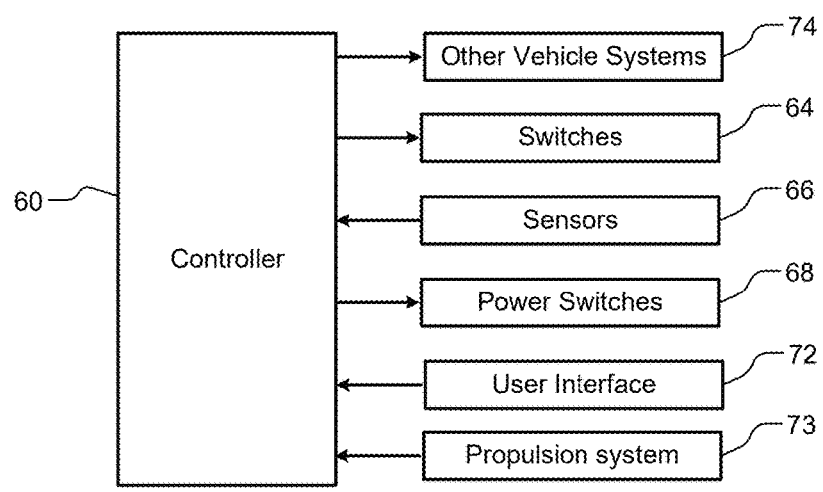
FIG. 3 is a functional block diagram of an example of a controller for the power control system according to the present disclosure.

Referring now to FIG. 3, a controller 60 executes an application configured to control the power switches 68 of the DC-DC converter 36, the power inverter module 22 and switches 64 (including switches S1 to S12 and SPC) based upon inputs from sensors 66 (such as current, voltage, temperature, speed, torque, and other sensors), a user interface 72, a propulsion system 73, other vehicle systems 74, or other input. While a single controller 60 is shown, one or more controllers can be used.

In some examples, the voltage sensors include a first voltage sensor VS1 (FIG. 1) sensing voltage across the resistor $R_{PC}$ (a precharge voltage), a second voltage sensor VS2 (FIG. 1) senses voltage at the input of the DC-DC converter 36 (a voltage across the capacitor C1), a third voltage sensor VS3 (FIG. 1) sensing voltage at the output of the DC-DC converter 36, a fourth voltage sensor VS4 (FIG. 2) sensing voltage at the input of the PIM 22 and a fifth voltage sensor VS5 (FIG. 2) sensing voltage across the capacitor C2.

Figure 4:
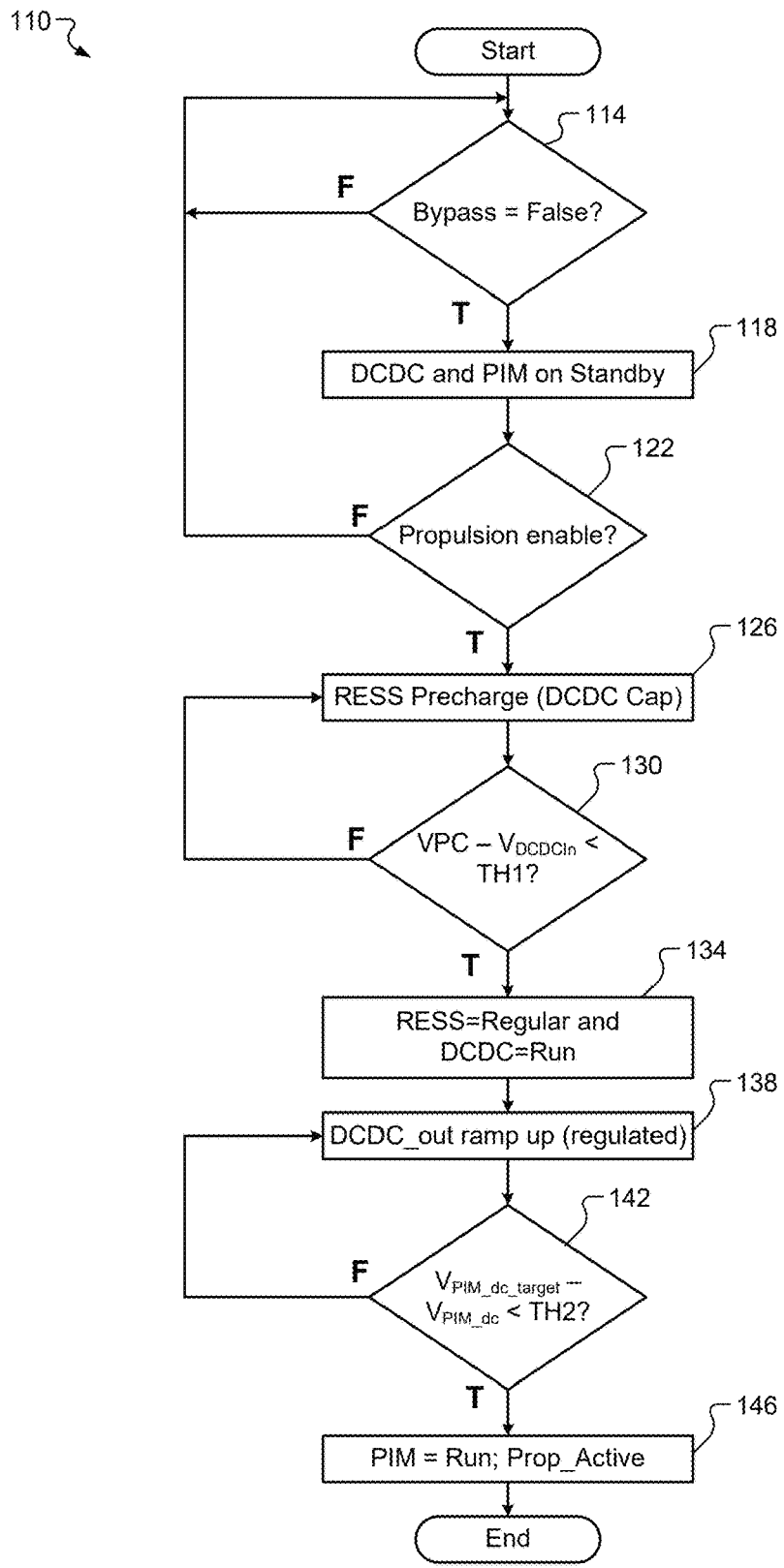
FIG. 4 is a flowchart illustrating an example of a method for pre-charging capacitors of the DC-DC converter and the power inverter module when a bypass switch is not used according to the present disclosure.

Referring now to FIG. 4, a method 110 is shown for pre-charging capacitors of the DC-DC converter 36 and the PIM 22 when a bypass switch is not used. During precharging, the controller 60 causes the switches SPC and S6 to close to charge the capacitor C1 and/or other capacitors in the PIM 22 and/or the loads 18.

At 114, the method determines whether the power control system does not include a bypass switch (or the bypass switch is off or open). If 114 is true, the method continues at 118 and the method sets the mode of the DC-DC converter 36 and the PIM 22 to standby. At 122, the method determines whether the propulsion system has been commanded on. If true, the method pre-charges the capacitor C1 (e.g. by closing the switches SPC and S6 in FIG. 1) to charge the capacitor C1.

The method determines a difference between a voltage $V_{PC}$ across the resistor $R_{PC}$ and voltage $V_{DCDCIn}$ at the input of the DC-DC converter 36. When the difference is less than a first predetermined threshold, the method transitions the mode of the RESS 34 from precharge to regular mode (by opening SPC and closing S5) and the mode of the DC-DC converter 36 to run at 134. At 138, the output of the DC-DC converter 36 is increased incrementally to properly charge the capacitor in the power inverter module. For example, the voltage is controlled to provide a ramp, stair-step or monotonically increasing voltage. In other words, pulse width modulation (PWM) of the switches in the DC-DC converter 36 is used to gradually increase the output of the DC-DC converter 36 from an initial voltage (which may be zero or non-zero) towards a target voltage level ($V_{PIM\_dc\_target}$).

When a difference between the voltage at the input of the PIM (or $V_{PIM\_dc}$) and $V_{PIM\_dc\_target}$ is within a second predetermined threshold (TH2) as determined at 142, the method continues at 146 and the mode of the PIM 22 is transitioned to run and the mode of the propulsion system is transitioned to active.

Figure 5:
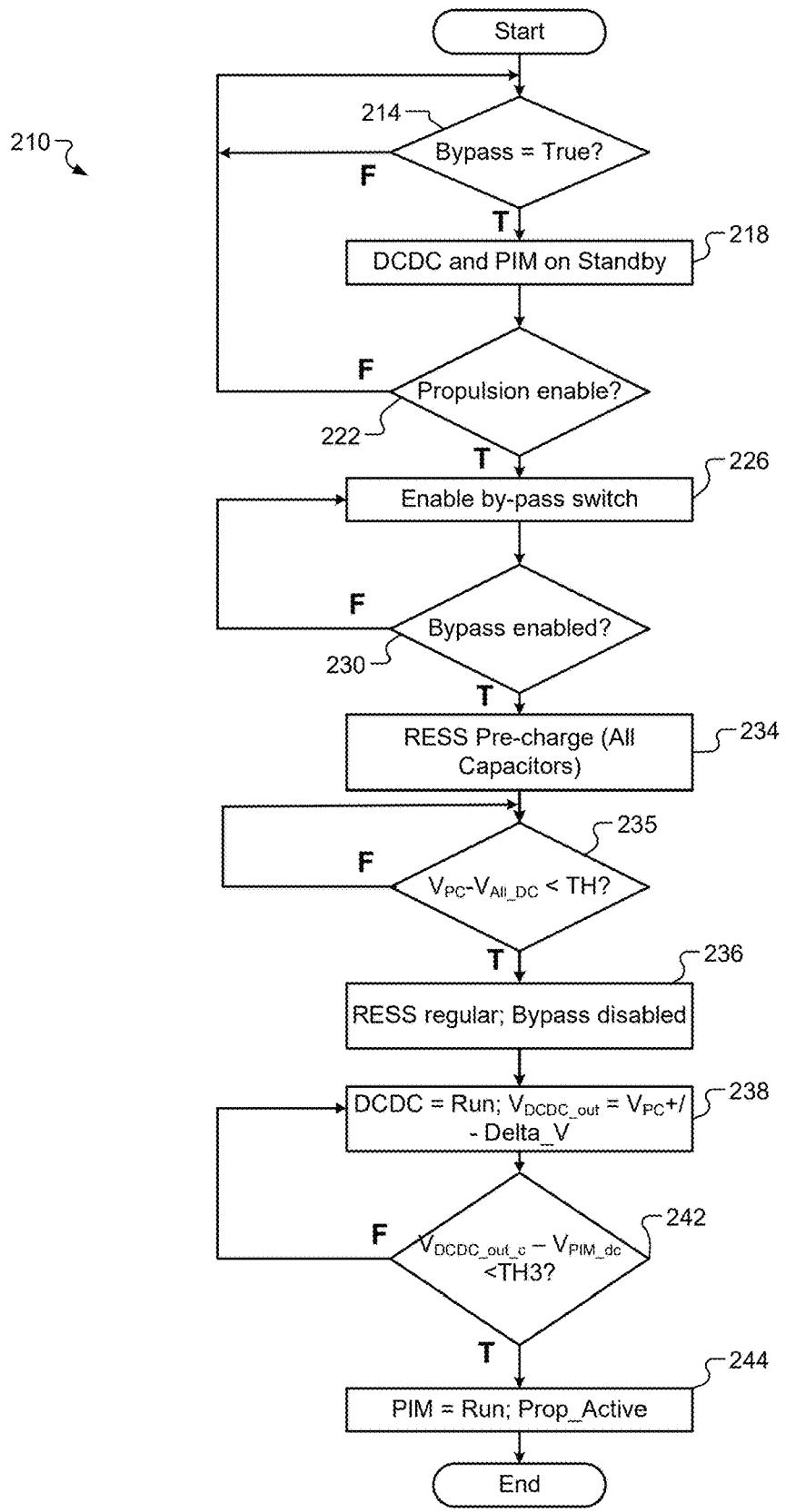
FIG. 5 is a flowchart illustrating an example of a method for pre-charging capacitors of the DC-DC converter and the power inverter module when a bypass switch is used according to the present disclosure.

Referring now to FIG. 5, a method 210 is shown for pre-charging capacitors of the DC-DC converter 36 and the PIM 22 during startup when the power control system includes the bypass switch S0 (commanded on or closed). At 214, the method determines whether the power control system includes the bypass switch S0. If 214 is true, the method continues at 218 and sets the mode of the DC-DC converter 36 and the PIM 22 to standby. At 222, the method determines whether the propulsion system has been enabled. If 222 is true, the method enables or closes the bypass switch S0. At 230, the method determines whether the bypass switch S0 is enabled or closed.

If 230 is true, the method pre-charges the capacitors C1 and C2 by closing the switches SPC and S6 to charge both of the capacitors C1 and C2 at 234. At 235, the method determines whether a difference between VPC and VAII_DC is less than a predetermined threshold TH. If 235 is true, the method continues at 236 and transitions the RESS 34 to regular mode (open SPC and close S5) and the bypass switch to disabled (or open).

At 238, the method transitions the mode of the DC-DC converter 36 to run. The method increases the voltage at the output of the DC-DC converter 36 (e.g. ramp, stair-step or monotonically) to controllably increase the voltage across the capacitors.

For example, the voltage (initially at $V_{RESS}$ at the end of 234) can be adjusted by +/−Delta_V. The voltage steps are repeated until the voltage across the capacitor C2 is equal to a desired DC-DC output voltage (which can be greater than or less than $V_{RESS}$). At 242, the method determines whether $V_{DCDC\_out}$ (the target voltage output of the DC-DC converter 36) minus $V_{PIM\_dc}$ (the voltage across the capacitor C2) is less than a third threshold TH3. If 242 is true, the mode of the PIM 22 is set to run and the propulsion system is set to active.

Figure 6:
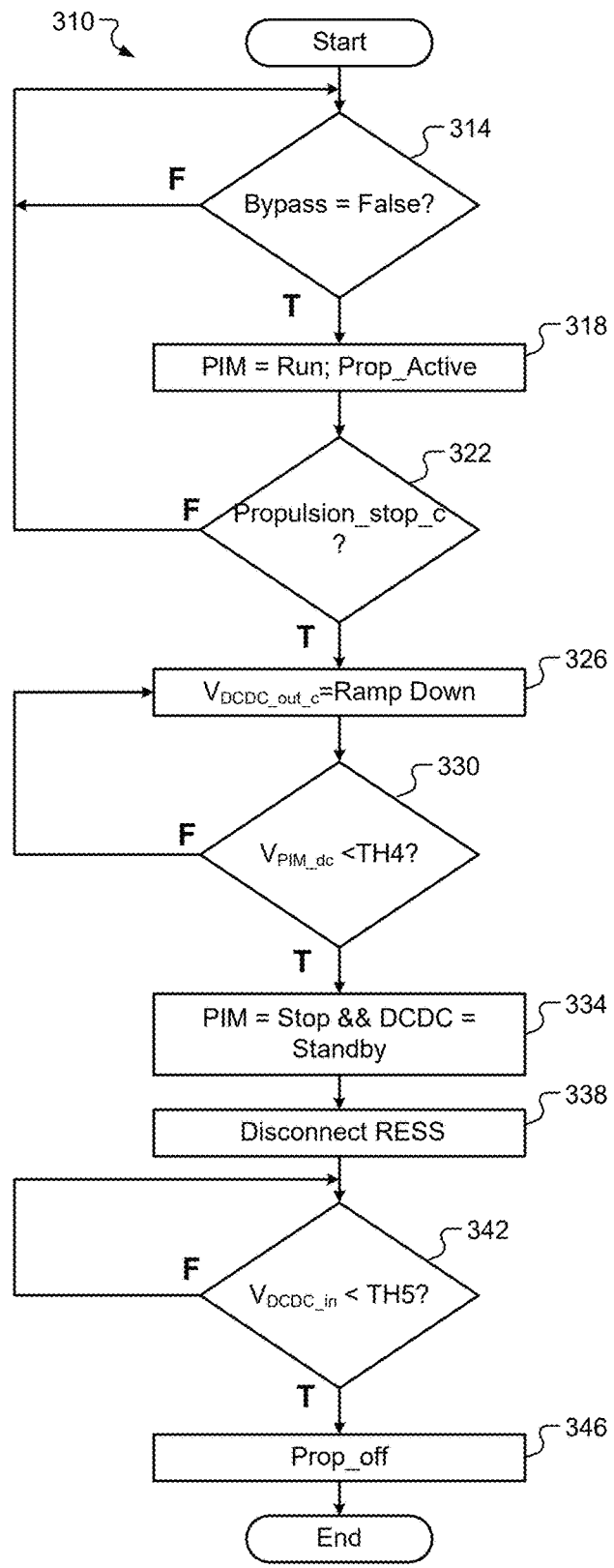
FIG. 6 is a flowchart illustrating an example of a method for shutting down capacitors of the DC-DC converter and the power inverter module when a bypass switch is not used according to the present disclosure.

Referring now to FIG. 6, a method 310 is shown for shutting down capacitors of the DC-DC converter 36 and the PIM 22 when the bypass switch S0 is open or not used. At 314, the method determines whether the power control system does not include the bypass switch S0. If 314 is true, the method continues at 318 and the sets the mode of the PIM 22 to run and the mode of the propulsion system to active. At 322, the method determines whether the mode of the propulsion system transitions to stop.

If 322 is true, the method sets the output of the DC-DC converter 36 to ramp down from a current voltage. When the inverter voltage ($V_{PIM\_dc}$) is less than a fourth threshold (TH4), the method continues at 334 and sets the mode of the PIM 22 to stop and the mode of the DC-DC converter 36 to standby. At 338, the RESS 34 is disconnected using S5 and S6. When the $V_{DCDCIn}$ is less than a fifth threshold TH5, the propulsion system is turned off at 346.

Figure 7:
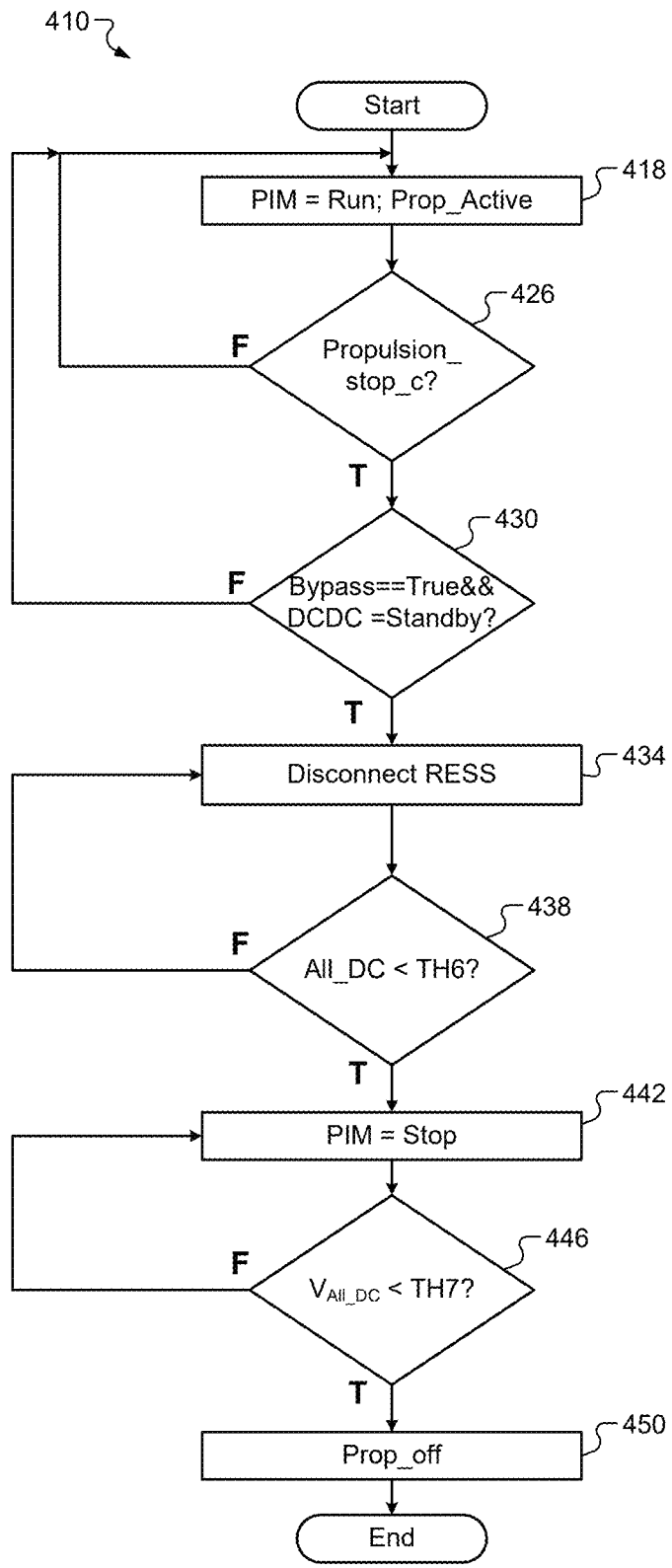
FIG. 7 is a flowchart illustrating an example of a method for shutting down capacitors of the DC-DC converter and the power inverter module when a bypass switch is used according to the present disclosure.

Referring now to FIG. 7, a method 410 is shown for shutting down capacitors of the DC-DC converter 36 and the PIM 22 when the bypass switch S0 is turned on. At 418 and the sets the mode of the PIM 22 to run and the mode of the propulsion system to active. At 426, the method determines whether the mode of the propulsion system transitions to stop. If 426 is true, the method determines whether bypass is true and DC_DC converter 36 is in standby mode.

If 426 is true, the RESS 34 is disconnected using S5 and S6. When All_DC ($V_{PIM\_dc}$ and/or $V_{DCDCIN}$) are less than a sixth threshold TH6, the mode of the propulsion system is set to stop at 442. At 446, the method determines whether $V_{All\_DC(Caps)}$ (voltages across capacitors C1 and C2) are less than a seventh threshold TH7, the mode of the propulsion system is set to off at 450.

The foregoing description is merely illustrative in nature and is in no way intended to limit the disclosure, its application, or uses. The broad teachings of the disclosure can be implemented in a variety of forms. Therefore, while this disclosure includes particular examples, the true scope of the disclosure should not be so limited since other modifications will become apparent upon a study of the drawings, the specification, and the following claims. It should be understood that one or more steps within a method may be executed in different order (or concurrently) without altering the principles of the present disclosure. Further, although each of the embodiments is described above as having certain features, any one or more of those features described with respect to any embodiment of the disclosure can be implemented in and/or combined with features of any of the other embodiments, even if that combination is not explicitly described. In other words, the described embodiments are not mutually exclusive, and permutations of one or more embodiments with one another remain within the scope of this disclosure.

Spatial and functional relationships between elements (for example, between modules, circuit elements, semiconductor layers, etc.) are described using various terms, including "connected," "engaged," "coupled," "adjacent," "next to," "on top of," "above," "below," and "disposed." Unless explicitly described as being "direct," when a relationship between first and second elements is described in the above disclosure, that relationship can be a direct relationship where no other intervening elements are present between the first and second elements, but can also be an indirect relationship where one or more intervening elements are present (either spatially or functionally) between the first and second elements. As used herein, the phrase at least one of A, B, and C should be construed to mean a logical (A OR B OR C), using a non-exclusive logical OR, and should not be construed to mean "at least one of A, at least one of B, and at least one of C."

In the figures, the direction of an arrow, as indicated by the arrowhead, generally demonstrates the flow of information (such as data or instructions) that is of interest to the illustration. For example, when element A and element B exchange a variety of information but information transmitted from element A to element B is relevant to the illustration, the arrow may point from element A to element B. This unidirectional arrow does not imply that no other information is transmitted from element B to element A. Further, for information sent from element A to element B, element B may send requests for, or receipt acknowledgements of, the information to element A.

In this application, including the definitions below, the term "module" or the term "controller" may be replaced with the term "circuit." The term "module" may refer to, be part of, or include: an Application Specific Integrated Circuit (ASIC); a digital, analog, or mixed analog/digital discrete circuit; a digital, analog, or mixed analog/digital integrated circuit; a combinational logic circuit; a field programmable gate array (FPGA); a processor circuit (shared, dedicated, or group) that executes code; a memory circuit (shared, dedicated, or group) that stores code executed by the processor circuit; other suitable hardware components that provide the described functionality; or a combination of some or all of the above, such as in a system-on-chip.

The module may include one or more interface circuits. In some examples, the interface circuits may include wired or wireless interfaces that are connected to a local area network (LAN), the Internet, a wide area network (WAN), or combinations thereof. The functionality of any given module of the present disclosure may be distributed among multiple modules that are connected via interface circuits. For example, multiple modules may allow load balancing. In a further example, a server (also known as remote, or cloud) module may accomplish some functionality on behalf of a client module.

The term code, as used above, may include software, firmware, and/or microcode, and may refer to programs, routines, functions, classes, data structures, and/or objects. The term shared processor circuit encompasses a single processor circuit that executes some or all code from multiple modules. The term group processor circuit encompasses a processor circuit that, in combination with additional processor circuits, executes some or all code from one or more modules. References to multiple processor circuits encompass multiple processor circuits on discrete dies, multiple processor circuits on a single die, multiple cores of a single processor circuit, multiple threads of a single processor circuit, or a combination of the above. The term shared memory circuit encompasses a single memory circuit that stores some or all code from multiple modules. The term group memory circuit encompasses a memory circuit that, in combination with additional memories, stores some or all code from one or more modules.

The term memory circuit is a subset of the term computer-readable medium. The term computer-readable medium, as used herein, does not encompass transitory electrical or electromagnetic signals propagating through a medium (such as on a carrier wave); the term computer-readable medium may therefore be considered tangible and non-transitory. Non-limiting examples of a non-transitory, tangible computer-readable medium are nonvolatile memory circuits (such as a flash memory circuit, an erasable programmable read-only memory circuit, or a mask read-only memory circuit), volatile memory circuits (such as a static random access memory circuit or a dynamic random access memory circuit), magnetic storage media (such as an analog or digital magnetic tape or a hard disk drive), and optical storage media (such as a CD, a DVD, or a Blu-ray Disc).

The apparatuses and methods described in this application may be partially or fully implemented by a special purpose computer created by configuring a general purpose computer to execute one or more particular functions embodied in computer programs. The functional blocks, flowchart components, and other elements described above serve as software specifications, which can be translated into the computer programs by the routine work of a skilled technician or programmer.

The computer programs include processor-executable instructions that are stored on at least one non-transitory, tangible computer-readable medium. The computer programs may also include or rely on stored data. The computer programs may encompass a basic input/output system (BIOS) that interacts with hardware of the special purpose computer, device drivers that interact with particular devices of the special purpose computer, one or more operating systems, user applications, background services, background applications, etc.

The computer programs may include: (i) descriptive text to be parsed, such as HTML (hypertext markup language), XML (extensible markup language), or JSON (JavaScript Object Notation) (ii) assembly code, (iii) object code generated from source code by a compiler, (iv) source code for execution by an interpreter, (v) source code for compilation and execution by a just-in-time compiler, etc. As examples only, source code may be written using syntax from languages including C, C++, C #, Objective-C, Swift, Haskell, Go, SQL, R, Lisp, Java®, Fortran, Perl, Pascal, Curl, OCaml, Javascript®, HTML5 (Hypertext Markup Language 5th revision), Ada, ASP (Active Server Pages), PHP (PHP: Hypertext Preprocessor), Scala, Eiffel, Smalltalk, Erlang, Ruby, Flash®, Visual Basic®, Lua, MATLAB, SIMULINK, and Python®.

What is claimed is:

1. A power control system for a propulsion system of a vehicle, comprising:
    an energy storage system including a precharge circuit and one or more battery packs;
    a DC-DC converter connected to the energy storage system and including a first capacitor, a first plurality of power switches and an inductor;
    a power inverter module connected to the DC-DC converter and including a second capacitor and a second plurality of power switches; and
    a controller configured to:
        pre-charge the first capacitor of the DC-DC converter and the second capacitor of the power inverter module; and
        control operating modes of the DC-DC converter and the power inverter module,
    wherein the controller is configured to at least one of
        after pre-charging the first capacitor of the DC-DC converter, control an output voltage of the DC-DC converter to ramp up voltage across the second capacitor of the power inverter module to pre-charge the second capacitor, and
        close a bidirectional bypass switch and concurrently pre-charge the first capacitor and the second capacitor, the bidirectional bypass switch being connected between the power inverter module and the energy storage system, and
    wherein the controller is configured to
        when stopping the propulsion system, ramp down the output voltage of the DC-DC converter to the voltage less than a first predetermined threshold,
        when the output voltage of the DC-DC converter is less than the first predetermined threshold, transition the power inverter module from a run mode to a stop mode and the DC-DC converter from a run mode to a standby mode, and
        disconnect the energy storage system and, when an input voltage of the DC-DC converter is less than a second predetermined threshold, transition the propulsion system from an active mode to a stop mode.

2. The power control system of claim 1, wherein the controller is configured to, after pre-charging the first capacitor of the DC-DC converter, control the output voltage of the DC-DC converter to ramp up voltage across the second capacitor of the power inverter module to pre-charge the second capacitor.

3. The power control system of claim 1, wherein the controller is configured to, after pre-charging the first capacitor of the DC-DC converter, transition the DC-DC converter from the standby mode to the run mode and control the output voltage of the DC-DC converter to ramp up the voltage across the second capacitor of the power inverter module to pre-charge the second capacitor.

4. The power control system of claim 1, further comprising the bidirectional bypass switch connected between the power inverter module and the energy storage system.

5. The power control system of claim 4, wherein the controller is configured to close the bidirectional bypass switch and concurrently pre-charge the first capacitor and the second capacitor.

6. The power control system of claim 5, wherein, in response to a difference between a voltage across a pre-charge resistor in the energy storage system and a voltage of the first capacitor being less than the first predetermined threshold, the controller selectively transitions the energy storage system to a regular mode and opens the bidirectional bypass switch.

7. The power control system of claim 6, wherein:
    the controller determines a difference between the output voltage of the DC-DC converter and an input voltage of the power inverter module;
    while the difference is greater than the second predetermined threshold, the controller incrementally adjusts the output voltage of the DC-DC converter by a delta voltage; and
    when the difference is less than the second predetermined threshold, the controller transitions the power inverter module from a stop mode to a run mode and the propulsion system from an off mode to the active mode.

8. The power control system of claim 4, wherein when the propulsion system is in the active mode, the bidirectional bypass switch is closed and the DC-DC converter is in standby mode, the controller is configured to stop the propulsion system by:
    disconnecting the energy storage system; and transitioning the power inverter module from a run mode to a stop mode when output voltages of the DC-DC converter and the power inverter module are less than the first predetermined threshold.

9. The power control system of claim 8, wherein when voltages across the first capacitor and the second capacitor are less than the second predetermined threshold, the controller transitions the propulsion system from the active mode to an off mode.

10. A power control system for a propulsion system of a vehicle, comprising:
an energy storage system including a precharge circuit and one or more battery packs;
a DC-DC converter connected to the energy storage system and including a first capacitor, a first plurality of power switches and an inductor;
a power inverter module connected to the DC-DC converter and including a second capacitor and a second plurality of power switches; and
a controller configured to
pre-charge the first capacitor of the DC-DC converter and the second capacitor of the power inverter module, and
control operating modes of the DC-DC converter and the power inverter module,
wherein at least one of
ii) when a difference between an input voltage of the power inverter module and a predetermined target voltage is less than a predetermined threshold, the controller transitions the power inverter module from a stop mode to a run mode and the propulsion system from a stop mode to an active mode, and
ii) the power control system further comprises a bidirectional bypass switch connected between the power inverter module and the energy storage system, and when a) the propulsion system is in the active mode, b) the bidirectional bypass switch is closed and c) the DC-DC converter is in standby mode, the bidirectional bypass switch being connected between the power inverter module and the energy storage system, and the controller being configured to stop the propulsion system by
disconnecting the energy storage system, and
transitioning the power inverter module from a run mode to a stop mode when output voltages of the DC-DC converter and the power inverter module are less than a first predetermined threshold.

11. A power control system for a propulsion system of a vehicle, comprising:
an energy storage system including a precharge circuit and one or more battery packs;
a DC-DC converter connected to the energy storage system and including a first capacitor, a first plurality of power switches and an inductor;
a power inverter module connected to the DC-DC converter and including a second capacitor and a second plurality of power switches; and
a controller configured to:
pre-charge the first capacitor of the DC-DC converter;
transition the DC-DC converter from a standby mode to a run mode; and
determine a difference between an output voltage of the DC-DC converter and an input voltage of the power inverter module:
while the difference is greater than a first predetermined threshold, ramp the output voltage of the DC-DC converter; and
when the difference is less than the first predetermined threshold, transition the power inverter module from a stop mode to a run mode and the propulsion system from an off mode to an active mode.

12. The power control system of claim 11, wherein when stopping the propulsion system, the controller is configured to:
selectively ramp down the output voltage of the DC-DC converter;
when the output voltage of the DC-DC converter is less than a second predetermined threshold, transition the power inverter module from a run mode to a stop mode and the DC-DC converter from a run mode to a standby mode;
disconnect the energy storage system; and
when an input voltage of the DC-DC converter is less than a third predetermined threshold, transition the propulsion system from the active mode to a stop mode.

13. A power control system for a propulsion system of a vehicle, comprising:
an energy storage system including a precharge circuit and one or more battery packs;
a DC-DC converter connected to the energy storage system and including a first capacitor, a first plurality of power switches, an inductor and a bidirectional bypass switch;
a power inverter module connected to the DC-DC converter and including a second capacitor and a second plurality of power switches,
wherein the bidirectional bypass switch is connected between the power inverter module and the energy storage system; and
a controller configured to:
close the bidirectional bypass switch and concurrently pre-charge the first capacitor and the second capacitor; and
after pre-charging the first capacitor and the second capacitor, transition a mode of the DC-DC converter from a standby mode to a run mode.

14. The power control system of claim 13, wherein the controller is configured to calculate a difference between an output voltage of the DC-DC converter and an input voltage of the power inverter module.

15. The power control system of claim 14, wherein:
when the difference is greater than a predetermined threshold, the controller is configured to incrementally adjust the output voltage of the DC-DC converter by a delta voltage; and
when the difference is less than the predetermined threshold, the controller is configured to transition the power inverter module from a stop mode to a run mode and the propulsion system from an off mode to an active mode.

16. The power control system of claim 13, wherein when the propulsion system is in an active mode, the bidirectional bypass switch is closed and the DC-DC converter is in standby mode, the controller is configured to stop the propulsion system by:
disconnecting the energy storage system; and
transitioning the power inverter module from a run mode to a stop mode when an output voltage of the DC-DC converter and an input voltage of the power inverter module are less than a first predetermined threshold.

17. The power control system of claim 16, wherein when voltages of the first capacitor and the second capacitor are less than a second predetermined threshold, the controller transitions the propulsion system from the active mode to an off mode.

* * * * *